(12) United States Patent
Boretti

(10) Patent No.: US 12,513,843 B2
(45) Date of Patent: Dec. 30, 2025

(54) DIN RAIL AND WALL MOUNTED ENCLOSURE ASSEMBLY AND METHOD OF USE

(71) Applicant: SCHNEIDER ELECTRIC BUILDINGS AMERICAS, INC., Carrollton, TX (US)

(72) Inventor: David John Boretti, Salem, NH (US)

(73) Assignee: Schneider Electric Buildings Americas, Inc., Carrollton, TX (US)

( * ) Notice: Subject to any disclaimer, the term of this patent is extended or adjusted under 35 U.S.C. 154(b) by 0 days.

(21) Appl. No.: 18/644,690

(22) Filed: Apr. 24, 2024

(65) Prior Publication Data
US 2025/0338419 A1   Oct. 30, 2025

(51) Int. Cl.
*A47B 96/00* (2006.01)
*H05K 5/02* (2006.01)
*H05K 7/14* (2006.01)

(52) U.S. Cl.
CPC ............. *H05K 7/14* (2013.01); *H05K 5/0221* (2013.01); *H05K 5/0226* (2013.01); *H05K 5/023* (2013.01)

(58) Field of Classification Search
CPC ...... H05K 7/14; H05K 5/0221; H05K 5/0226; H05K 5/023
See application file for complete search history.

(56) References Cited

U.S. PATENT DOCUMENTS

| | | | |
|---|---|---|---|
| 5,316,164 A | 5/1994 | Feuerlein et al. | |
| 5,904,592 A * | 5/1999 | Baran | H02B 1/052 361/627 |
| 6,424,547 B2 | 7/2002 | Murabayashi et al. | |
| 8,226,433 B1 * | 7/2012 | Correll | H01R 9/2608 439/532 |
| 9,099,823 B2 | 8/2015 | Lai | |
| 9,374,924 B2 * | 6/2016 | Boretti | H05K 7/1401 |
| 9,485,879 B2 * | 11/2016 | Molnar | H05K 5/0026 |
| 10,845,773 B2 | 11/2020 | Mielnik et al. | |
| 2013/0322044 A1 * | 12/2013 | Kusumi | H05K 7/14 361/807 |
| 2014/0199864 A1 * | 7/2014 | Devanand | H01R 9/2608 439/116 |
| 2022/0120466 A1 | 4/2022 | Zheng et al. | |

FOREIGN PATENT DOCUMENTS

| | | |
|---|---|---|
| DE | 4431520 A1 | 3/1996 |
| DE | 19709811 A1 | 9/1998 |
| DE | 102013103544 A1 | 10/2014 |
| GB | 2123614 B | 10/1985 |
| GB | 2521445 A | 6/2015 |

OTHER PUBLICATIONS

Gesis Flex—Decentralized KNX Room Automation, https://www.wieland-electric.com/en/products/electrical-installation/room-automation/gesis-flex/.

* cited by examiner

*Primary Examiner* — Amy J. Sterling
(74) *Attorney, Agent, or Firm* — Quinn IP Law

(57) ABSTRACT

A mounting enclosure assembly is configured to mount an electronic component onto a Deutsches Institut für Normung (DIN) rail. The mounting enclosure includes a mounting bracket including a body having a slot configured to receive the DIN rail therein. A locking mechanism is operatively connected to the body of the mounting bracket to selectively engage and disengage the mounting enclosure assembly to the DIN rail. There is also a position for mounting the mounting bracket to a flat surface, e.g. where there is no DIN rail.

16 Claims, 3 Drawing Sheets

DIN RAIL AND WALL MOUNTED ENCLOSURE ASSEMBLY AND METHOD OF USE

BACKGROUND

1. Field

The present disclosure relates generally to the field of electronics, and more particularly to assemblies and methods for securing and removing electronic components to and from a rail system, such as a Deutsches Institut für Normung (DIN) rail system.

2. Description of Related Art

Current DIN-mounted devices are designed with a single DIN clip or multiple DIN clips that require a tool and two hands when installing or removing the device from a standard 35 mm DIN rail. Installing or removing these larger devices can be very difficult, particularly for devices that are of a size that requires two or more DIN clips. For example, when trying to remove a larger device one typically needs to push one DIN clip in a downward direction with a tool to disengage the device from the DIN rail. While holding up that portion of the device with one hand to prevent reattachment, one must use their other hand to release the other DIN clip with the tool. Such removal can prove to be very difficult, time consuming, and counter-intuitive for users. In addition, traditional devices configured for mounting to DIN rails do not facilitate an option to mount to flat surfaces such as a wall, ceiling, or the like. Existing flat-surface-mounting options are either not sturdy, e.g., with only two mounting holes, or difficult to install, e.g., screws are needed behind the enclosure, requiring use of a template or other similar means.

The conventional techniques have been considered satisfactory for their intended purpose. However, there is an ever-present need for improved systems and methods for rail or surface mounting electronics enclosures. This disclosure provides a solution for this need.

SUMMARY

A mounting enclosure assembly is configured to mount an electronic component onto a DIN rail. The mounting enclosure includes a mounting bracket including a body having a slot configured to receive the DIN rail therein, wherein the slot extends along a longitudinal axis. A locking mechanism is operatively connected to the body of the mounting bracket to selectively engage and disengage the mounting enclosure assembly to the DIN rail. The locking mechanism includes a release handle, a protrusion positioned proximate to the slot and configured to releasably engage a first flange of the DIN rail, and a hinged armature operatively connected to the release handle and to the protrusion to disengage the first flange of the DIN rail with the release handle in a release position, and to engage the first flange of the DIN rail with the release handle in a lock position, to lock the first flange of the DIN rail between the protrusion and the slot. The release handle is configured to slide back and forth between the release position and the lock position in a direction parallel to the longitudinal axis.

The hinged armature can include a flexible hinge member connecting between an axial beam and an inclined beam. The axial beam can be aligned parallel to the longitudinal axis. The inclined beam can be aligned obliquely relative to the longitudinal axis. The mounting bracket can include a ramp surface proximate the flexible hinge member which remains fixed relative to the release handle. In the release position, the ramp surface can engage the inclined beam of the hinged armature, biasing the inclined beam in a direction away from the slot, wherein the protrusion is operatively connected to the inclined beam so the protrusion retracts in a direction away from the slot to clear the first flange of the DIN rail. In the lock position, the ramp surface can bias the flexible hinge less than the ramp surface biases the flexible hinge in the release position. In the lock position, the ramp surface can be spaced apart from the inclined beam of the hinged armature.

A linkage can be operatively connected between the protrusion and the axial beam to cooperate with the flexible hinge member to maintain orientation of the protrusion relative to the longitudinal axis at both the release position and the lock position. The linkage and the flexible hinge member can be configured to maintain orientation of the protrusion relative to the longitudinal axis at both the release position and the lock position, and throughout a stroke of motion between the release position and the lock position. The flexible hinge member and the linkage can bias the protrusion toward the slot in a direction lateral to the longitudinal axis.

The locking mechanism can include a mounting plate operatively connected to the release handle. The mounting plate can protrude beyond a first end of the mounting bracket exposing mounting apertures of the mounting plate with the release handle in the locked position of the handle. The mounting plate can be configured to retract the mounting apertures inboard of the first end of the mounting bracket with the release handle in the release position.

A release stop can be fixed relative to the mounting plate and to the release handle wherein release stop is configured to abut the first a stop surface of the first end of the mounting bracket in the release position to limit motion of the mounting plate and release handle from going beyond the release position. The mounting bracket can include a guide track including a first track surface and an opposed second track surface each extending parallel to the longitudinal axis. The locking mechanism can include a first track rider slidingly engaged with the first track surface and a second track rider slidingly engaged with the second track surface. The first and second track riders can be fixed relative to the handle and to the mounting plate. The first and second track riders can be configured to guide the locking mechanism in motion parallel to the longitudinal axis between the lock position and the release position.

The protrusion can extend through a track opening through the first track surface. The track opening extends parallel to the longitudinal axis. The protrusion can be configured to slide along the track opening between the lock position and the release position. The track opening can include a protrusion stop surface at an end of the track opening most proximate to the lateral end of the mounting bracket. In the lock position the protrusion can engage the protrusion stop surface to limit motion of the mounting plate and release handle from going beyond the lock position.

A second locking mechanism can be operatively connected to the body of the mounting bracket to selectively engage and disengage the mounting enclosure assembly to the DIN rail. The second locking mechanism can include a second release handle, a second protrusion positioned proximate, and a second hinged armature as described above with reference to the first locking mechanism. The second locking mechanism can be symmetrical with the first locking mechanism across a plane perpendicular to the longitudinal axis. In the release position, the first and second handles can be closer to one another than in the lock position so actuating the first and second handles toward one another can release the mounting bracket from the DIN rail and actuating the first and second handles away from one another locks the mounting bracket to the DIN rail.

A method of securing and releasing a mounting enclosure assembly to and from a DIN rail includes manually actuating a first handle of a first locking mechanism and a second handle of a second locking mechanism toward one another in a direction along a longitudinal axis of a mounting bracket of the mounting enclosure assembly to which the first and second locking mechanisms are engaged. The method includes engaging a slot of the mounting bracket to the DIN rail. The method includes manually actuating the first and second handles away from one another in the direction along the longitudinal axis, thereby bringing a first protrusion of the first locking mechanism, and a second protrusion of a second locking mechanism into engagement with a first flange of the DIN rail wherein the first flange is captured between the slot and the first and second protrusions.

The method can include manually actuating the first and second handles toward one another in the direction along the longitudinal axis, thereby retracting the first and second protrusions from engagement with the first flange of the DIN rail. The method can include removing the mounting bracket from the DIN rail.

A method of securing a mounting enclosure assembly to a surface includes manually actuating a first handle of a first locking mechanism and a second handle of a second locking mechanism away from one another in the direction along a longitudinal axis of a mounting bracket to which the first and second locking mechanisms are engaged, thereby extending a first mounting plate of the first locking mechanism, and a second mounting plate of a second locking mechanism beyond respective first and second lateral ends of the mounting bracket relative to the longitudinal axis. The method includes securing the mounting bracket to the flat surface with fasteners passing through the first and second mounting plates and into the flat surface. Securing the mounting bracket to the flat surface can include driving at least two fasteners through respective openings of each of the first and second mounting plates.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
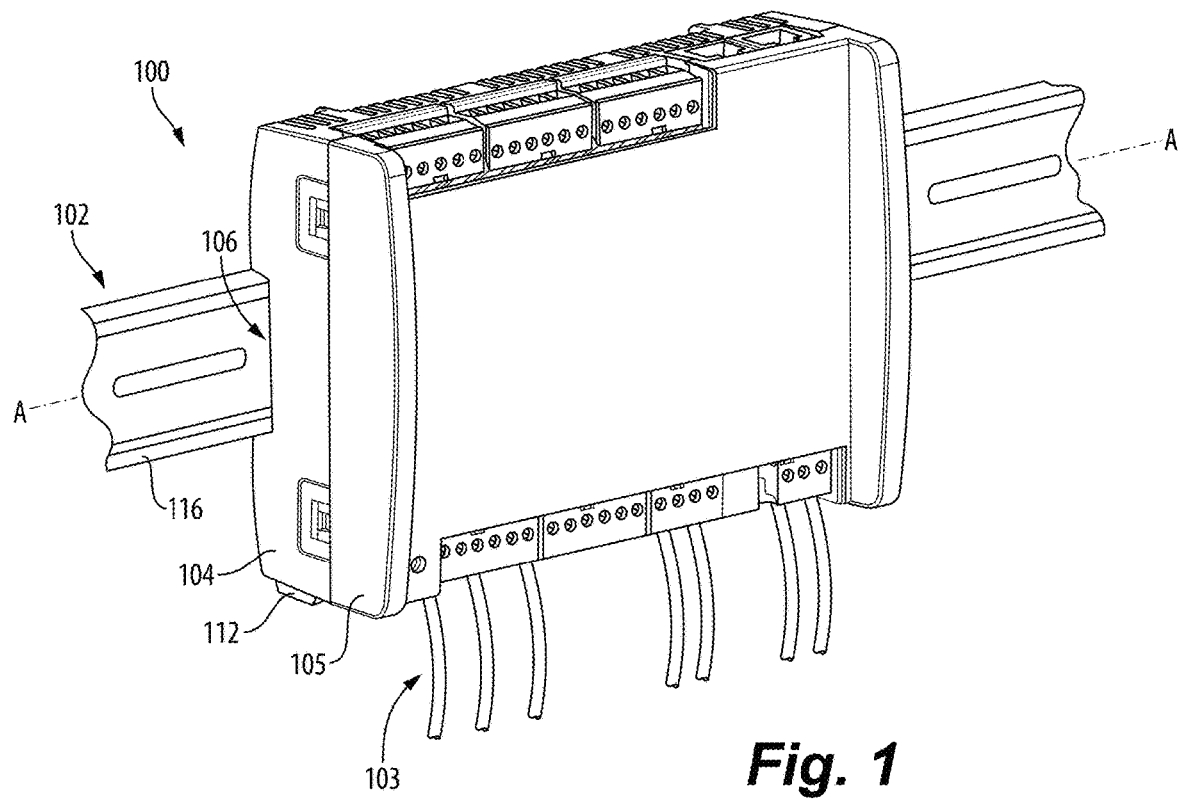
FIG. 1 is a schematic perspective view of an embodiment of a mounting enclosure assembly constructed in accordance with the present disclosure, showing the mounting plates retracted.

Reference will now be made to the drawings wherein like reference numerals identify similar structural features or aspects of the subject disclosure. For purposes of explanation and illustration, and not limitation, a partial view of an embodiment of a mounting enclosure assembly in accordance with the disclosure is shown in FIG. 1 and is designated generally by reference character 100. Other embodiments of systems in accordance with the disclosure, or aspects thereof, are provided in FIGS. 2-6, as will be described. The systems and methods described herein can be used to facilitate mounting modules to Deutsches Institut für Normung (DIN) rails or to flat surfaces such as walls, ceilings, interior cabinet surfaces, and the like.

The mounting enclosure assembly 100 is configured to mount an electronic component onto a DIN rail 102. The electronic component can include a printed circuit board assembly (PCBA) or the like, room controls, breakers, or the like, housed inside the mounting enclosure assembly 100. Cables and/or wires 103 pass through the mounting closure assembly 100 to connect to the electronic component. The DIN rail 102 provides mechanical support for the mounting enclosure assembly 100 and the cables and/or wires connected thereto. As further discussed below, the mounting enclosure assembly 100 is also configured to mount to any suitable flat surface instead of being mounted to a DIN rail 102. The mounting enclosure assembly 100 includes a mounting bracket 104 including a body having a slot 106 configured to receive the DIN rail 102 therein. The slot 106 extends along a longitudinal axis A.

Figure 2:
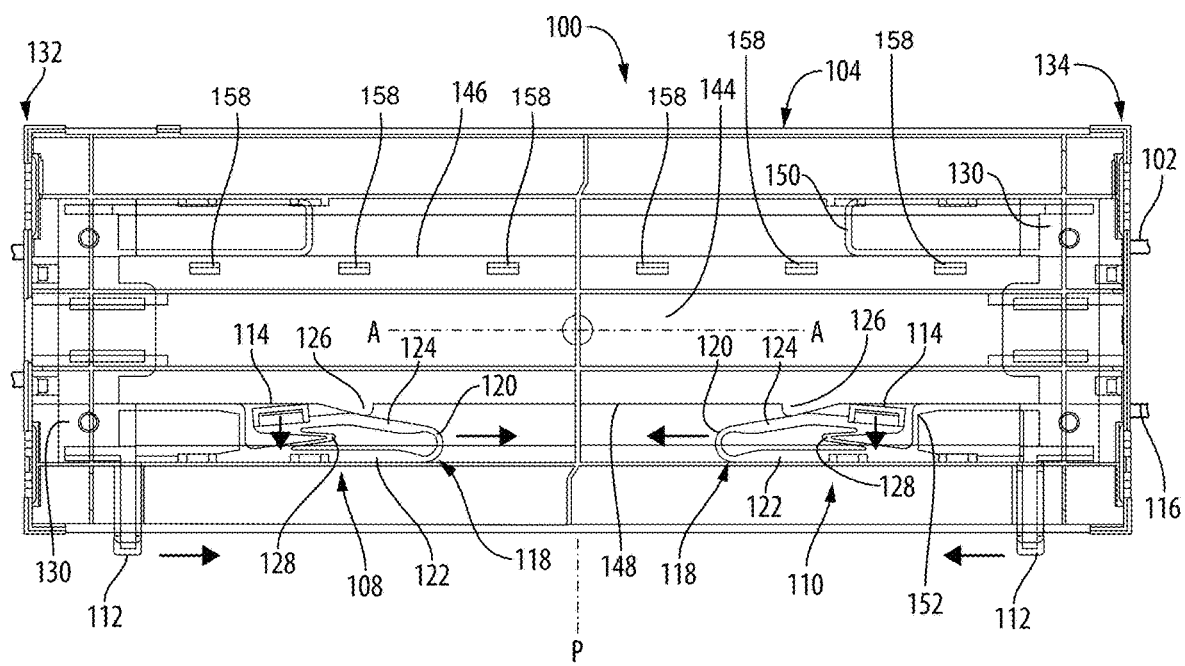
FIG. 2 is a schematic front elevation view of the assembly of FIG. 1, showing a front plate removed to show the locking mechanisms in the release position.

With reference now to FIG. 2, where the front cover 105 of the mounting enclosure assembly 100 of FIG. 1 is shown removed, a pair of locking mechanisms 108, 110 are operatively connected to the body of the mounting bracket 104 to selectively engage and disengage the mounting enclosure assembly to the DIN rail 102. Each locking mechanism 108, 110 includes a release handle 112, a protrusion 114 positioned proximate to the slot 106 (labeled in FIG. 1) and configured to releasably engage a first flange 116 of the DIN rail 102, and a hinged armature 118 operatively connected to the release handle 112 and to the protrusion 114. The hinged armature 118 is operative to disengage the first flange 116 of the DIN rail 102 with the release handle 112 in a release position as shown in FIG. 2, and to engage the first flange 116 of the DIN rail 102 with the release handle 112 in a lock position shown in FIGS. 3 and 5, to lock or capture the first flange 116 of the DIN rail 102 between the protrusion 114 and the slot 106. The release handle 112 is configured to slide back and forth between the release position shown in FIG. 2 and the lock position of FIGS. 3 and 5 in a direction parallel to the longitudinal axis A, as indicated by the directional arrows in FIG. 2.

The hinged armature 118 includes a flexible hinge member 120 connecting between an axial beam 122 and an inclined beam 124. The axial beam 122 is aligned parallel to the longitudinal axis A in all positions of its respective locking mechanism 108, 110. The inclined beam 124 is aligned obliquely relative to the longitudinal axis A. The mounting bracket 104 includes a ramp surface 126 proximate each of the flexible hinge members 120 which remains fixed relative to the release handles 112. In the release position shown in FIG. 2, the ramp surface 126 engages the inclined beam 124 of the hinged armature 118, biasing the inclined beam 124 in a direction away from the slot 106, e.g., downward as oriented in FIGS. 2, 3, and 5. The protrusion 114 is operatively connected to the inclined beam 124 so the protrusion 114 retracts in a direction away from the slot 106, e.g., downward in FIGS. 2, 3, and 5, to clear the first flange 116 of the DIN rail 102. This release position can be used for mounting and removing the assembly 100 to and from the DIN rail 102. In the lock position shown in FIGS. 3 and 5, the ramp surface 126 biases the flexible hinge member 120 less than it does in the release position if it biases the flexible hinge at all in the lock position. In the lock position, the ramp surface 126 can be spaced apart from the inclined beam 124 of the hinged armature 118.

Figure 3:
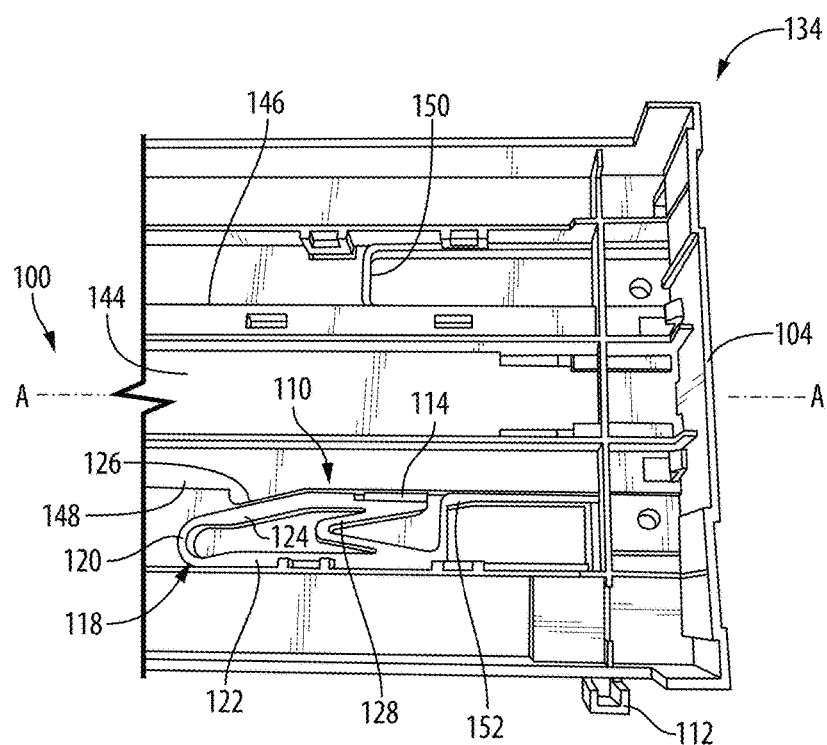
FIG. 3 is a schematic front elevation view of a portion of the assembly of FIG. 2, showing the locking mechanism in a lock position with the mounting plate retracted.
Figure 4:
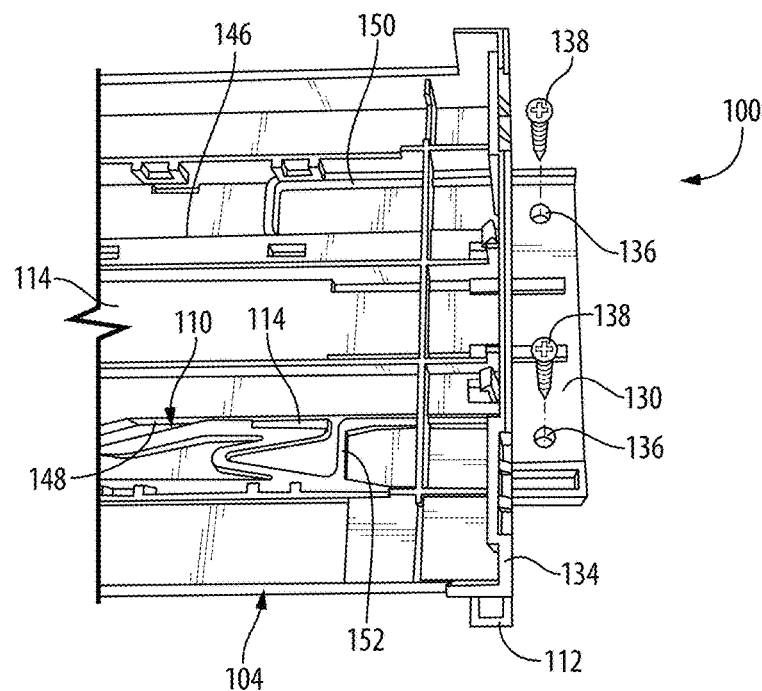
FIG. 4 is a schematic front elevation view of a portion of the assembly of FIG. 2, showing the protrusion of the locking mechanism in a lock position with the mounting plate extended for mounting to a flat surface.
Figure 5:
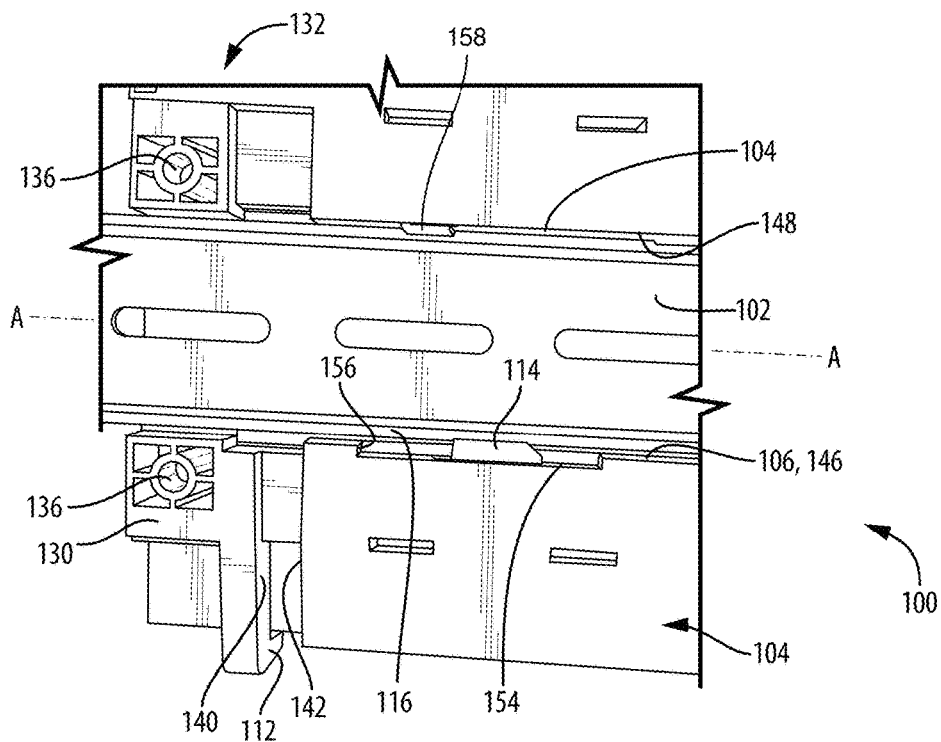
FIG. 5 is a back elevation view of a portion of the assembly of FIG. 3, showing the mounting plate retracted and the protrusion of the locking mechanism in the lock position engaged to the DIN-rail.

A linkage 128 is operatively connected between the protrusion 114 and the axial beam 122 to cooperate with the flexible hinge member 120 to maintain orientation of the protrusion 114 relative to the longitudinal axis A at both the release position of FIG. 2 and the lock position of FIGS. 3 and 5. The linkage 128 compresses in the lock position shown in FIG. 2. The linkage 128 and the flexible hinge member 120 are configured to at least roughly maintain orientation of the protrusion 114 relative to the longitudinal axis A at both the release position of FIG. 2 and the lock position of FIGS. 3-5, and throughout a stroke of motion between the release position and the lock position. The flexible hinge member 120 and the linkage 128 bias the protrusion 114 toward the slot 106 (labeled in FIG. 1) in a direction lateral to the longitudinal axis A. The flexible hinge member 120 and the linkage 128 are a flexible, compliant mechanism, however those skilled in the art will readily appreciate equivalent structures of rigid linkages, hinges, and springs or other biasing members can be used as well.

Each locking mechanism 108, 110 includes a mounting plate 130 operatively connected to the release handle 112. In a mounting position of the locking mechanisms 110, shown in FIG. 4, the mounting plate 130 protrudes beyond a first end 132 of the mounting bracket 104. This exposes mounting apertures 136 of the mounting plate 130 with the release handle in the mounting position. The mounting position of FIG. 4 can be considered to be a sub-position or extension of the locked position of the handle 112, e.g., once the handle 112 is in the locked position of FIGS. 3 and 5, continued motion to the right as oriented in FIG. 4 extends the mounting plate 130 while keeping the protrusion 114 in its locked position relative to the slot 106 labeled in FIG. 1. Although not shown, those skilled in the art will readily appreciate that the locking mechanism 108 on the opposite end of the mounting bracket 104, as shown in FIG. 2 similarly has a mounting position in which its plate 130 is exposed beyond the end 134 of the mounting bracket 104. The mounting plate 130 is configured to retract the mounting apertures 136 inboard of the first end 132 of the mounting bracket 104 with the release handle 112 in the release position shown in FIG. 2, as well as in the initial position of the locked but retracted mounting plate position shown in FIGS. 3 and 5. Thes retracted position of the mounting plate 130 allows for multiple modules such as The mounting enclosure assembly 100 to be mounted flush side by side to one another on a DIN rail 102 of FIG. 1, as well as for reducing the amount of space needed for packing, shipping, and handling. Since in the extended position of the mounting plates 130 as shown in FIG. 4, the mounting apertures 136 are exposed next to the enclosure of the assembly 100, the assembly 100 can be mounted directly to a flat surface such as a wall, ceiling, cabinet interior, or the like using fasteners 138 without any need for using a template necessary to position the fasteners 138.

Figure 6:
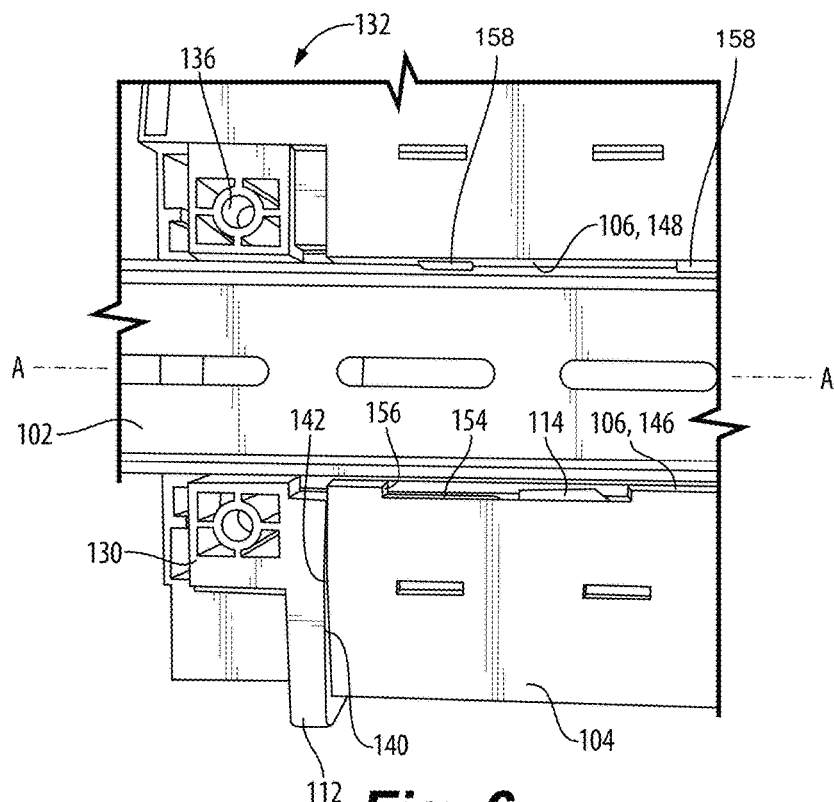
FIG. 6 is a back elevation view of a portion of the assembly of FIG. 1, showing the release handle stopped against an end surface of the lateral end of the mounting bracket with the protrusion in the release position retracted from the DIN-rail.

With reference now to FIGS. 5-6, a release stop 140 is fixed relative to the mounting plate 130 and to the release handle 112 wherein release stop 140 is configured to abut the first a stop surface 142 of the first end 132 of the mounting bracket 104 in the release position as shown in FIG. 6 to limit motion of the mounting plate 130 and release handle 112 from going beyond the release position, e.g., to prevent the mounting plate 130 from going any further to the right as oriented in FIG. 6.

With reference again to FIG. 2, the mounting bracket 104 includes a guide track 144, which is the reverse side of the slot 106 labeled in FIG. 1. The guide track 144 includes a first track surface 146 and an opposed second track surface 148 each extending parallel to the longitudinal axis A. Each of the locking mechanisms 108, 110 includes a first track rider 152 slidingly engaged with the first track surface 146 and a second track rider 150 slidingly engaged with the second track surface 148. The first and second track riders 150, 152 are fixed relative to the handle 112 and to the mounting plate 130. The first and second track riders 150, 152 are configured to guide the locking mechanism 108, 110 in motion parallel to the longitudinal axis A between the lock position of FIGS. 3 and 5 and the release position of FIG. 2.

With referenced again to FIGS. 5 and 6, the protrusion 114 extends through a track opening 154 through the first track surface. The track opening 154 extends parallel to the longitudinal axis A. The protrusion 114 is configured to slide along the track opening 154 between the lock position of FIG. 5 and the release position of FIG. 6. The track opening 154 includes a protrusion stop surface 156 at an end of the track opening 154 most proximate to the lateral end 132 (or 134 in the case of locking mechanism 110, labeled in FIG. 1) of the mounting bracket 104. In the fully extended mounting position of the lock position, shown in FIG. 4, the protrusion 114 engages the protrusion stop surface 156 to limit motion of the mounting plate 130 and release handle 112 from going beyond the lock position, e.g., beyond the extended lock position referred to herein as the mounting position. The track opening 154 is long enough, and the ramp surface 126 (labeled in FIGS. 2-3) is spaced far enough from the respective end 132, 134 of the mounting bracket 104 that the protrusion 114 can remained locked against the DIN rail 102 with the mounting plate 130 is fully retracted into the mounting bracket 104 before the respective ramp surface 126 engages the locking mechanism 108, 110 in the release position.

With continued reference to FIGS. 5-6, there are fixed protrusions 158 fixed protrusions (six are labeled in FIG. 2, but any suitable number can be used) that run along top side of slot 106 as oriented in FIGS. 5-6. These protrusions 158 can hook on to the top flange 116 of the DIN rail 102 first, then the device can rotate down as a clam shell mechanism into position engaging the protrusion 114 to the bottom flange 116 of the DIN rail 102 as oriented in FIGS. 5-6. The protrusion 114 also has a chamfer (on its front facing surface visible in FIG. 2) which can cause protrusion 114 to move downward as it is pressed against the bottom flange 116 then, once the protrusion 114 has cleared the bottom edge of the bottom flange 116, the protrusion can return to the locked position securing mounting bracket 104 to the DIN rail 102 without need for use of the handles 112 because of the bias of the hinged armature 118. This enables operation of the mounting bracket 104 with or without the handles 112 when pushing the mounting bracket 104 onto a DIN rail 102. The handles 112 can be used to unlock the mounting bracket 104 from a DIN rail 102 for sliding into the wall mount position shown in FIG. 4. Also the flexible hinge member 120 and inclined beam 124 can act like a spring, for example if one slides the handles 112 into the unlock position with and then releases the handles 112, the protrusion 114 can spring back into the lock position automatically. In this situation the protrusion 114 can act like an end stop when it hits the stop surface 156 which limits how far the mounting plate 130 can extend out of mounting enclosure as shown in FIG. 4.

With again reference to FIG. 2, the second locking mechanism 110 is symmetrical with the first locking mechanism 108 across a plane P perpendicular to the longitudinal axis A. In the release position shown in FIG. 2, the first and second handles 112 are closer to one another than in the lock position of FIGS. 3 and 5, so actuating the first and second handles 112 toward one another releases the mounting bracket 104 from the DIN rail 102 and actuating the first and second handles 112 away from one another locks the mounting bracket 108 to the DIN rail 102. Since the handles 112 are actuated in opposite directions from one another, the manual actuating forces cancel each other out to help keep the mounting bracket 104 in position while actuating.

To mount the enclosure assembly 100 to a DIN rail 102 as shown in FIG. 1, a user can actuate the handles 112 toward one another into the release position as indicated by the directional arrows in FIG. 2. Then the user can seat the slot 106 of the mounting bracket 104 on the DIN rail 102 as shown in FIG. 1. Finally, the user can actuate the handles 112 away from each other into the lock position shown in FIGS. 3-5, e.g., without necessarily actuating the handles 112 far enough in the lock position to expose the mounting plates 130 past the ends 132, 134 of the mounting bracket 104. This locks the protrusions 114 onto the first flange 116 of the DIN rail 102. Actuating the handles 112 back toward one another to the release position as indicated in FIG. 2 frees the DIN rail 102 from the protrusions 114 for removal of the enclosure assembly 100 from the DIN rail 102.

If instead it is desired to mount the enclosure assembly 100 to a flat surface such as a wall, ceiling, or cabinet interior surface, the handles 112 can be actuated in the opposite direction of that indicated by the direction arrows in FIG. 2, e.g., away from one another, until the mounting plates 130 are fully exposed as shown in FIG. 4. Then four fasteners 138 can be driven in the four respective mounting apertures 136, and into the flat surface to secure the assembly 100 to the flat surface.

The mounting plate 130 is able to slide into the surface mount position (as shown in FIG. 4) even when mounted on a DIN rail 102 if an operator wants to prevent tampering/removal of mounting bracket 104 without tool. Once the fasteners 138 are installed, the mounting plate 130 cannot move, which keeps the protrusion 114 in the lock position on the DIN rail 102.

Systems and methods as disclosed herein provide potential benefits including the following. The operator can utilize an easier method of securing and releasing a device to/from a DIN rail strip without the need of additional tools. There are also additional options of mounting a device to a flat surface via retractable mounting plates and fasteners. Additionally the mounting tabs can be retracted inside device when mounting to a DIN rail strip inside a cabinet while maintaining DIN 43880 compliancy. Also the benefits to having retractable mounting tabs is they free up space inside enclosure providing more area on printed circuit board (PCB) for circuit development since incorporated mounting holes, e.g., in a polymer material, would require more space to accommodate. The systems and methods disclosed herein can operate without tools. They provide multiple ways to mount a controller inside and outside of a DIN compliant cabinet. The locking mechanisms do not consume valuable space within the enclosure for electronics or block ventilation or the like.

The methods and systems of the present disclosure, as described above and shown in the drawings, provide for mounting modules to DIN-rails or to flat surfaces such as walls, ceilings, interior cabinet surfaces, and the like. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A mounting enclosure assembly configured to mount an electronic component onto a Deutsches Institut für Normung (DIN) rail, the assembly comprising:
   a mounting bracket including a body having a slot configured to receive the DIN rail therein, wherein the slot extends along a longitudinal axis; and
   a locking mechanism operatively connected to the body of the mounting bracket to selectively engage and disengage the mounting enclosure assembly to the DIN rail, the locking mechanism including:
     a release handle,
     a protrusion positioned proximate to the slot and configured to releasably engage a first flange of the DIN rail,
     a hinged armature operatively connected to the release handle and to the protrusion to disengage the first flange of the DIN rail with the release handle in a release position, and to engage the first flange of the DIN rail with the release handle in a lock position, to lock the first flange of the DIN rail between the protrusion and the slot, wherein the release handle is configured to slide back and forth between the release position and the lock position in a direction parallel to the longitudinal axis.

2. The assembly as recited in claim 1, wherein the hinged armature includes a flexible hinge member connecting between an axial beam and an inclined beam, wherein the axial beam is aligned parallel to the longitudinal axis, and wherein the inclined beam is aligned obliquely relative to the longitudinal axis.

3. The assembly as recited in claim 2, wherein the mounting bracket includes a ramp surface proximate the flexible hinge member which remains fixed relative to the release handle, wherein in the release position, the ramp surface engages the inclined beam of the hinged armature, biasing the inclined beam in a direction away from the slot, wherein the protrusion is operatively connected to the inclined beam so the protrusion retracts in a direction away from the slot to clear the first flange of the DIN rail.

4. The assembly as recited in claim 3, wherein in the lock position, the ramp surface biases the flexible hinge less than the ramp surface biases the flexible hinge in the release position.

5. The assembly as recited in claim 3, wherein in the lock position, the ramp surface is spaced apart from the inclined beam of the hinged armature.

6. The assembly as recited in claim 2, further comprising a linkage operatively connecting between the protrusion and the axial beam to cooperate with the flexible hinge member to maintain orientation of the protrusion relative to the longitudinal axis at both the release position and the lock position.

7. The assembly as recited in claim 6, wherein the linkage and the flexible hinge member are configured to maintain orientation of the protrusion relative to the longitudinal axis at both the release position and the lock position, and throughout a stroke of motion between the release position and the lock position.

8. The assembly as recited in claim 6, wherein the flexible hinge member and the linkage bias the protrusion toward the slot in a direction lateral to the longitudinal axis.

9. The assembly as recited in claim 1, wherein the locking mechanism includes a mounting plate operatively connected to the release handle, wherein the mounting plate protrudes beyond a first end of the mounting bracket exposing mounting apertures of the mounting plate with the release handle in the locked position of the handle.

10. The assembly as recited in claim 9, wherein the mounting plate is configured to retract the mounting apertures inboard of the first end of the mounting bracket with the release handle in the release position.

11. The assembly as recited in claim 9, further comprising a release stop fixed relative to the mounting plate and to the release handle wherein release stop is configured to abut the first a stop surface of the first end of the mounting bracket in the release position to limit motion of the mounting plate and release handle from going beyond the release position.

12. The assembly recited in claim 9, wherein the mounting bracket includes a guide track including a first track surface and an opposed second track surface each extending parallel to the longitudinal axis, wherein the locking mechanism includes a first track rider slidingly engaged with the first track surface and a second track rider slidingly engaged with the second track surface, wherein the first and second track riders are fixed relative to the handle and to the mounting plate and are configured to guide the locking mechanism in motion parallel to the longitudinal axis between the lock position and the release position.

13. The assembly as recited in claim 12, wherein the protrusion extends through a track opening through the first track surface, wherein the track opening extends parallel to the longitudinal axis, wherein the protrusion is configured to slide along the track opening between the lock position and the release position.

14. The assembly as recited in claim 13, wherein the track opening includes a protrusion stop surface at an end of the track opening most proximate to a lateral end of the mounting bracket, wherein in the lock position the protrusion engages the protrusion stop surface to limit motion of the mounting plate and release handle from going beyond the lock position.

15. The assembly as recited in claim 1, wherein the locking mechanism is a first locking mechanism, wherein the release handle is a first release handle, the protrusion is a first protrusion, and the hinged armature is a first hinged armature and further comprising:
 a second locking mechanism operatively connected to the body of the mounting bracket to selectively engage and disengage the mounting enclosure assembly to the DIN rail, the second locking mechanism including:
  a second release handle,
  a second protrusion positioned proximate to the slot and configured to releasably engage a first flange of the DIN rail, and
  a second hinged armature operatively connected to the second release handle and to the second protrusion to disengage the first flange of the DIN rail with the second release handle in a release position, and to engage the first flange of the DIN rail with the second release handle in a lock position, to lock the first flange of the DIN rail between the second protrusion and the slot, wherein the second release handle is configured to slide back and forth between the release position and the lock position in a direction parallel to the longitudinal axis.

16. The assembly as recited in claim 15, wherein the in the release position, the first and second handles are closer to one another than in the lock position so actuating the first and second handles toward one another releases the mounting bracket from the DIN rail and actuating the first and second handles away from one another locks the mounting bracket to the DIN rail.

* * * * *